(12) United States Patent
Hochstein

(10) Patent No.: US 8,338,852 B2
(45) Date of Patent: Dec. 25, 2012

(54) SECTIONALLY COVERED LIGHT EMITTING ASSEMBLY

(75) Inventor: Peter A. Hochstein, Troy, MI (US)

(73) Assignee: Relume Technologies, Inc., Oxford, MI (US)

( * ) Notice: Subject to any disclaimer, the term of this patent is extended or adjusted under 35 U.S.C. 154(b) by 180 days.

(21) Appl. No.: 12/996,536

(22) PCT Filed: Jun. 5, 2008

(86) PCT No.: PCT/US2008/065870
§ 371 (c)(1),
(2), (4) Date: Jan. 21, 2011

(87) PCT Pub. No.: WO2009/148447
PCT Pub. Date: Dec. 10, 2009

(65) Prior Publication Data
US 2011/0114976 A1    May 19, 2011

(51) Int. Cl.
*H01L 31/048* (2006.01)
(52) U.S. Cl. ... 257/99; 257/712; 257/717; 257/E33.075; 438/28
(58) Field of Classification Search .............. 257/99, 257/712, 717, 722, E33.075; 438/28
See application file for complete search history.

(56) References Cited

U.S. PATENT DOCUMENTS

| | | | |
|---|---|---|---|
| 6,753,553 B2 | 6/2004 | Wu | |
| 7,344,279 B2 | 3/2008 | Mueller et al. | |
| 2007/0287342 A1 | 12/2007 | Russell et al. | |
| 2009/0159905 A1* | 6/2009 | Chen | 257/88 |
| 2009/0296390 A1* | 12/2009 | Dubord | 362/240 |
| 2010/0320499 A1* | 12/2010 | Catalano et al. | 257/99 |
| 2011/0084303 A1* | 4/2011 | Cho et al. | 257/99 |
| 2011/0110087 A1* | 5/2011 | Hochstein | 362/249.02 |

\* cited by examiner

*Primary Examiner* — Allan R Wilson
(74) *Attorney, Agent, or Firm* — Dickinson Wright, PLLC

(57) ABSTRACT

A light emitting assembly (10) includes an aluminum heat sink (12) having a plurality of elongated slots (18) which space and define a plurality of sections (20). A pair of fins (30) extend from each section (20) along opposite sides of each elongated slot (18). A plurality of integral bridges (26) extend across the elongated slots (18). A screen (54) is disposed over each of the elongated slots (18). A light transmissive independent cover (44) is adhesively secured to each of the sections (20) around the light emitting diodes (28) so that one cover (44) independently covers the light emitting diodes (28) on each of the sections (20). The covers (44) are separated by the elongated slots (18). A housing (50) is spaced from the fins (30) and includes vents (52) whereby cooling air passes through the slots (18), over the fins (30), and out the vents (52).

16 Claims, 3 Drawing Sheets

SECTIONALLY COVERED LIGHT EMITTING ASSEMBLY

CROSS-REFERENCE TO RELATED APPLICATIONS

This application is a National Stage of International Application No. PCT/US2008/065870, filed Jun. 5, 2008.

BACKGROUND OF THE INVENTION

1. Field of the Invention

The subject invention relates to a light emitting assembly of the type including light emitting diodes (L.E.D.s), and more particularly, to the avoidance of temperatures causing early degradation of the L.E.D.s.

2. Description of the Prior Art

The light emitting assemblies of the type to which this invention pertains include a plurality of L.E.D.s disposed on a mounting surface and surrounded by holes in the mounting surface. An example of such an assembly is disclosed in the U.S. Pat. No. 6,753,553 to Jiahn-Chang. The Jiahn-Chang patent discloses a light emitting assembly including a plurality of uncovered L.E.D.s disposed on the mounting surface of a circuit board defining uncovered holes located within the perimeter of the circuit board. The L.E.D.s may become damaged by water or environmental contaminants, especially in outdoor applications. The holes may become clogged with debris or other harmful objects, which impedes the flow of air through the holes.

The light emitting assemblies of the type to which this invention pertains also include a cover to protect a plurality of L.E.D.s mounted on a heat sink. An example of such an assembly is disclosed in the U.S. Pat. No. 5,857,767 to the present inventor, Peter A. Hochstein, which is directed to effective thermal management. The Hochstein '767 patent discloses a single transparent cover being large enough to cover and protect a plurality of L.E.D.s disposed on a heat sink. The single cover protects all of the L.E.D.s disposed on the heat sink from contaminants. In some configurations and uses, a single cover limits convective cooling because heat emitted from the L.E.D.s is not effectively transferred away from the L.E.D.s to surrounding air.

The prior art assemblies do not always sufficiently thermally manage light emitting diode assemblies while protecting them from the environment. As the power densities of covered L.E.D. assemblies continues to rise, the need for more effective thermal management increases. The cost-benefit calculus of light emitting assemblies is marginal unless the L.E.D.s are protected from the environment and the useful life of the L.E.D.s is at least seven years. Unfortunately, many assemblies disclosed in the prior art and currently in production operate at junction temperatures approaching 100 degrees Celsius, which virtually assures early degradation of the L.E.D.s.

SUMMARY OF THE INVENTION

The subject invention provides such a light emitting assembly including a plurality of light emitting diodes disposed on the mounting surface of a heat sink. The heat sink includes a plurality of elongated slots to define a plurality of sections disposed in spaced and parallel relationship to one another. The sections extend between opposite ends of the heat sink to present side edges of at least one elongated slot between adjacent sections. Ambient air passes through the elongated slots adjacent to the light emitting diodes disposed along each of the sections of the heat sink. The assembly includes a plurality of light transmissive independent covers separated by the elongated slots. Each cover is disposed over one of the sections so that one cover independently covers the light emitting diodes on the mounting surface of each section.

ADVANTAGES OF THE INVENTION

The individual covers separated by elongated slots improves the heat rejection from the heat sink by allowing cooler ambient air flow through the heat sink and past the L.E.D.s in the center of the assembly, which otherwise run hotter and are more subject to thermal degradation than the L.E.D.s along the edge of the assembly, as their thermal resistance to ambient air is higher. The convective cooling also reduces the temperature of the air in the stagnation zones between the fins, which further improves the heat rejection from the heat sink to ambient air. The invention is cost effective because the temperature reduction improves the reliability and useful life of the L.E.D.s. For nominally horizontal light emitting assemblies, the unobstructed air flow through the heat sink and past the independent covers can reduce the temperature rise of the assembly by approximately 28 degrees Celsius or about twenty eight percent (28%). For downward facing lamps, like those in the majority of street lamps, the improved cooling is truly significant. The same topography may also be applied to traffic signals of all types, message boards, or other large area light emitting assemblies.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
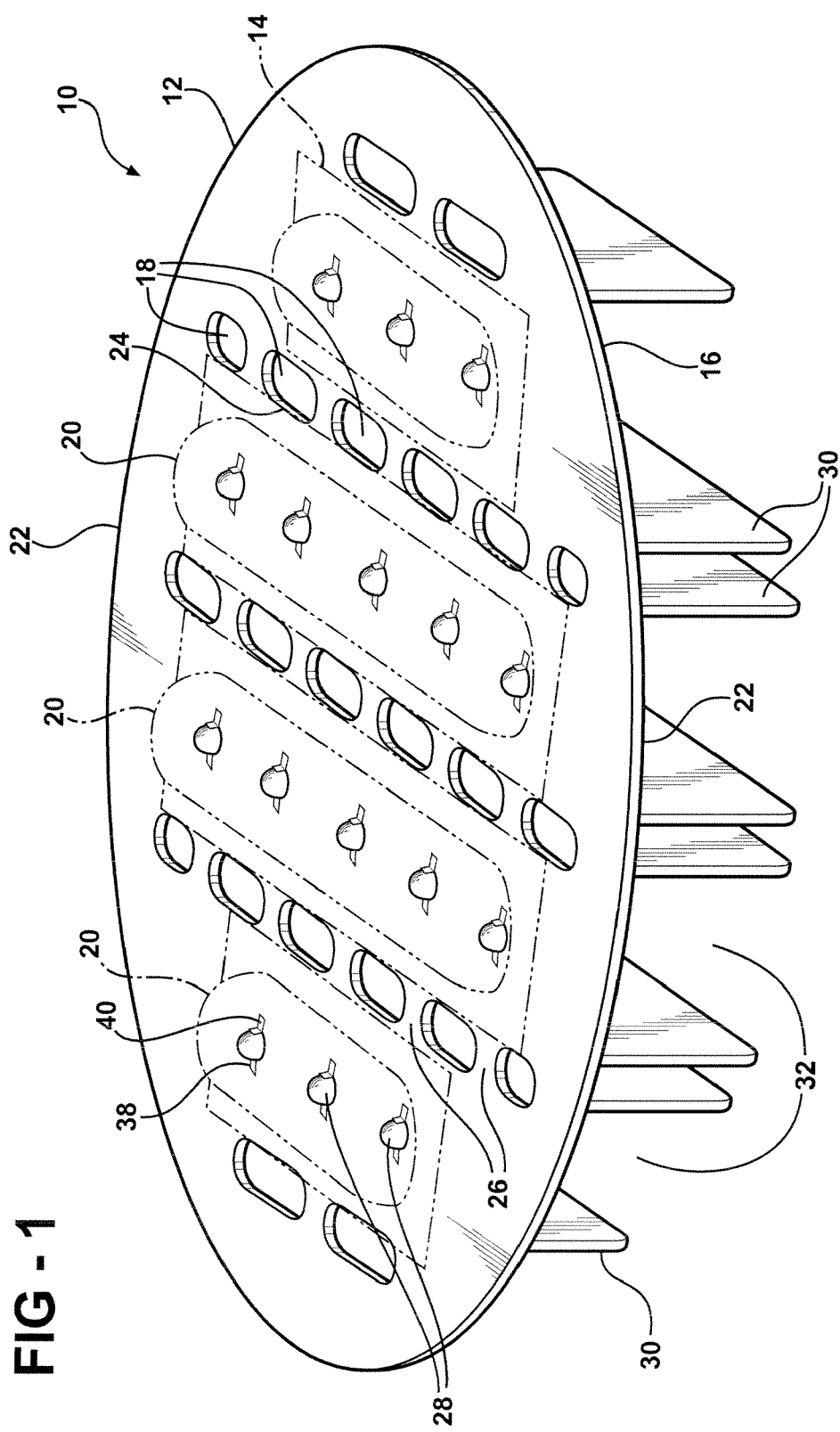
FIG. 1 is perspective view of a preferred embodiment of the subject invention wherein the periphery of the heat sink is round.
Figure 2:
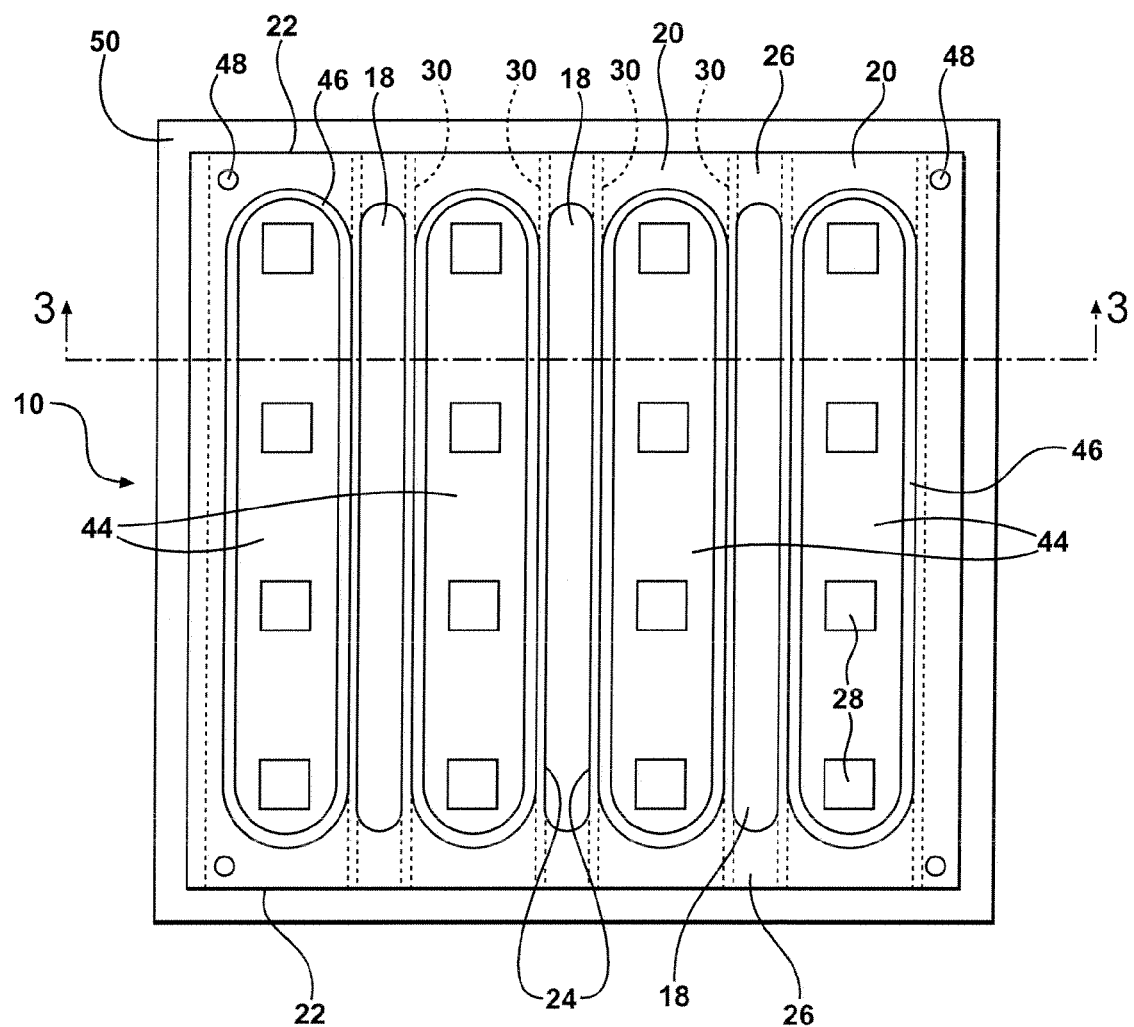
FIG. 2 is a top view of a second embodiment wherein the periphery of the heat sink is four-sided.

Referring to the Figures, a light emitting assembly 10 is generally shown. The light emitting assembly 10 comprises an electrically and thermally conductive heat sink 12, generally indicated. The heat sink 12 is preferentially made of metal, such as a homogeneous aluminum or an aluminum alloy. The heat sink 12 is formed as by casting, forging, or fabrication to present a mounting surface 14 and an oppositely facing heat transfer surface 16. The heat sink 12 is also formed to include a plurality of elongated slots 18 to define a plurality of sections 20 disposed in spaced and parallel relationship to one another. The sections 20 extend between opposite ends 22 of the heat sink 12 to present side edges 24 of at least one elongated slot 18 between adjacent ones of the sections 20 for enhancing the convective cooling of the assembly 10 by allowing ambient air to pass through the elongated slots 18 of the heat sink 12. The plurality of elongated slots 18 between each of the sections 20 of the heat sink 12 are shown as each elongated slot 18 having the same length and width and extending into the heat sink 12 with the same depth. However, each of the elongated slots 18 may have lengths, widths, and depths that differ from those shown and from one another.

The heat sink 12 includes at least one bridge 26, preferably a plurality of bridges 26, being integral and homogenous with the sections 20, i.e., the bridges 26 can be formed integrally with and of the same material and at the same time or simultaneously with the sections 20. The bridges 26 extend transversely across each of the elongated slots 18 to interconnect adjacent ones of the sections 20. Although the bridges 26 are shown as extending perpendicularly from the slots 18, they may extend at other angles transverse to or crossing the elongated slots 18. The bridges 26 are also shown as having similar lengths, widths, and dispositions relative to the light emitting diodes 28. However, each of the bridges 26 may have lengths, widths, and dispositions that differ from those shown and from one another.

The heat sink 12 includes a plurality of heat radiating fins 30, shown as extending transversely from the heat transfer surface 16 and being parallel and spaced relative to one another. One fin 30 is disposed along each one of the sides edges 24 of the sections 20. Each pair of fins 30 extends continuously between the ends 22 of each of the sections 20 to present a void space 32 between the two fins 30. Each pair of fins 30 is open at the ends 22 so that the void space 32 between each pair of fins 30 is exposed to air. The fins 30 are formed and designed to enhance the heat transfer of heat away from the heat sink 12 to surrounding ambient air. Although the fins 30 are shown as described above, they may extend at other angles relative to the heat transfer surface 16 and can be spaced differently relative to the elongated slots 18. The fins 30 may also have different cross sectional shapes than those shown, and they may contain perforations for enhanced convective cooling. The fins 30 can be formed integrally with and of the same material and at the same time or simultaneously with the heat sink 12 and sections 20. Alternatively, they can be formed of a different material and non-simultaneously with the heat sink 12 and sections 20.

The assembly 10 includes an electrically insulating coating 34 disposed over the mounting surface 14 of the heat sink 12. The coating 34 is less than one thousand microns thick, but preferably less than three hundred microns thick. The coating 34 may be continuous and cover the entire mounting surface 14 of the heat sink 12, or it may be disposed in circuitous tracks separated from one another by the bare metal of the heat sink 12. The coating 34 can be applied to the heat sink 12 with a screen printing method or by powder coating means.

After the coating 34 is applied, circuit traces 36 are disposed in spaced lengths from one another on the mounting surface 14 of the heat sink 12 to prevent electrical conduction between the traces 36. The circuit traces 36 also prevent electrical conduction from each of the traces 36 to the heat sink 12. At least three of the traces 36 extend in end to end relationship along at least one of the sections 20. The circuit traces 36 may be applied to the heat sink 12 by screen printing. The traces 36 may consist of a polymeric material having metal particles dispersed therein, such as an epoxy compound with a noble metal, or a phenolic resin compounded with either copper, silver, or nickel.

A plurality of L.E.D.s 28 are disposed on the mounting surface 14 to span the spaces between the ends of adjacent traces 36. Each one has a positive lead 38 and a negative lead 40 being in electrical engagement with the adjacent ones of the traces 36 to electrically interconnect the traces 36 and the L.E.D.s 28. At least two of the L.E.D.s 28 are disposed in each of the two spaces between the three adjacent traces 36 on each one of the sections 20. An electrically conductive adhesive 42 secures the leads 36, 38 of the light emitting diodes 28 to adjacent ones of the circuit traces 36. The L.E.D.s 28 are applied to the adhesive 42 as by a mechanical applicator, a stencil, or a robot pick and place machine. The L.E.D.s 28 on each of the sections 20 may be electrically interconnected in series with one another and electrically interconnected in parallel with the ones on other sections 20. The L.E.D.s 28 on each of the sections 20 are shown as being disposed parallel to one another and having a uniform space between each adjacent L.E.D. However, the plurality of L.E.D.s 28 on each section 20 may be disposed in a non-parallel alignment relative to the L.E.D.s 28 on adjacent sections 20, and the individual L.E.D.s 28 may have non-uniform spaces between one another. The electrical components of the assembly 10 are connected with printed, foil, or wire conductors, and the conductor feed-throughs must be sealed when the assembly 10 is used outdoors.

The assembly 10 includes a plurality of independent covers 44, with each cover 44 being disposed over one of the sections 20 so that one cover 44 independently covers the L.E.D.s 28 on each of the sections 20. The adjacent covers 44 are separated by the elongated slots 18. The covers 44 are light transmissive and formed of a glass or plastic material, such as polycarbonate. The independent covers 44 protect the L.E.D.s 28 and electrical components from precipitation, debris, sunlight, and other harmful effects that would be detrimental to the operation of the assembly 10. Each cover 44 defines a periphery 46 being in sealed engagement with the mounting surface 14 around the traces 36 of the L.E.D.s 28 without obstructing the ability of air to flow through the plurality of elongated slots 18 between the sections 20. Although the covers 44 are shown as having similar lengths, widths, and cross sectional shapes, they may have lengths, widths, and cross sectional shapes that differ from those shown and from one another. Each cover 44 is attached to the heat sink 12 with at least one connector 48, such as an adhesive material, like RTV silicone rubber. Other connectors 48 and methods of attachment may be used such as double faced foam tape or a replaceable gasket.

Figure 3:
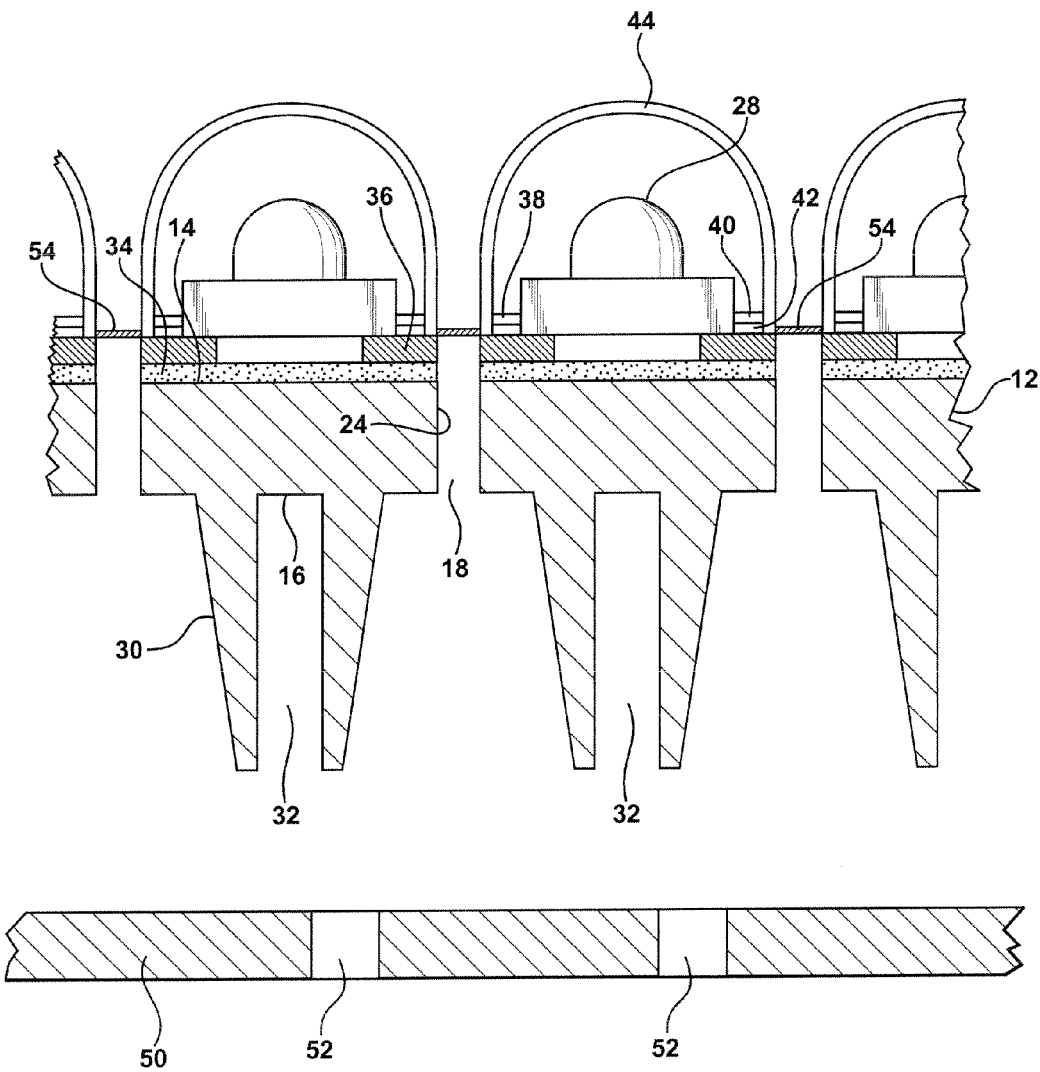
FIG. 3 is a fragmentary cross sectional view taken along line 3-3 of FIG. 2.

The assembly 10 includes a housing 50, shown in FIG. 3, covering and spaced from the heat transfer surface 16 of the heat sink 12. The housing 50 is designed to shield the sections 20 from precipitation, debris, and other harmful effects that would be detrimental to the assembly's 12 operation. The housing 50 also shields the sections 20 from sunlight, which reduces the temperature of the assembly 10. It is spaced away from the heat sink 12 to permit advantageous convective air flow over fins 30. The housing 50 is formed as by a vacuum, injection molding, or being drawn from thin metal. It may consist of a thermoplastic polyester [TPO] material, or a metal material such as stainless steel, for corrosion protection. The housing 50 includes hot air vents 52 for allowing ambient air to pass through the housing 50 and out the vents 52. The housing 50 shown includes two vents 52 being degrees out of position for clarity. However, it may include multiple hot air vents 52 or none at all. The housing 50 is secured to the assembly 10 with at least one connector 48, such a spring clip. Alternatively, the housing 50 may be connected with another type of mechanical connector, an adhesive, or it may be snapped in place.

A screen 54 is disposed over each of the elongated slots 18 in the heat sink 12 to prevent insects, leaves, and other debris from clogging the elongated slots 18 and impeding the convective air flow through the elongated slots 18. A screen 54 may also be disposed over the vents 52 in the housing 50.

Obviously, many modifications and variations of the present invention are possible in light of the above teachings and may be practiced otherwise than as specifically described while within the scope of the appended claims. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. A light emitting assembly (10) comprising:
a heat sink (12) presenting a mounting surface (14),
a plurality of light emitting diodes (28) disposed on said mounting surface (14),
said heat sink (12) including a plurality of elongated slots (18) to define a plurality of sections (20) disposed in spaced and parallel relationship to one another and extending between opposite ends (22) to present side edges (24) of at least one elongated slot (18) between adjacent sections (20) for allowing ambient air to pass through said elongated slots (18) of said heat sink (12) adjacent said light emitting diodes (28) disposed along each of said sections (20), and
a plurality of independent covers (44) with each cover (44) being light transmissive and disposed over one of said sections (20) so that one cover (44) independently covers said light emitting diodes (28) on said mounting surface (14) of each of said sections (20) and so that said covers (44) are separated by said elongated slots (18).

2. An assembly (10) as set forth in claim 1 wherein each of said covers (44) defines a periphery (46) being in sealed engagement with said mounting surface (14) around said light emitting diodes (28) on each of said sections (20).

3. An assembly (10) as set forth in claim 1 including a screen (54) disposed over at least one of said elongated slots (18) for preventing debris from passing through said elongated slots (18).

4. An assembly (10) as set forth in claim 1 wherein said heat sink (12) presents a heat transfer surface (16) facing in the opposite direction from said mounting surface (14) and including a plurality of fins (30) extending transversely from said heat transfer surface (16) of said heat sink (12) for transferring heat away from said heat sink (12) to surrounding ambient air.

5. An assembly (10) as set forth in claim 4 wherein said fins (30) are disposed in spaced and parallel relationship to one another.

6. An assembly (10) as set forth in claim 4 wherein one of said fins (30) is disposed along each of said edges (24) of said sections (20).

7. An assembly (10) as set forth in claim 4 wherein each of said fins (30) extends continuously between said ends (22) of each of said sections (20) to present a void space (32) between adjacent fins (30).

8. An assembly (10) as set forth in claim 7 wherein said void space (32) is open at said ends (22) for exposing said void space (32) between adjacent fins (30) to air.

9. An assembly (10) as set forth in claim 4 including a housing (50) covering and spaced from said heat transfer surface (16) and said fins (30) for shielding said sections (20).

10. An assembly (10) as set forth in claim 9 wherein said housing (50) includes at least one vent (52) for allowing ambient air to pass through said housing (50).

11. An assembly (10) as set forth in claim 9 including a plurality of connectors (48) securely connecting said housing (50) to at least one of said sections (20).

12. An assembly (10) as set forth in claim 1 including at least one bridge (26) extending transversely to said elongated slots (18) to interconnect adjacent sections (20).

13. An assembly (10) as set forth in claim 12 wherein said bridge (26) is integral and homogenous with said sections (20).

14. An assembly (10) as set forth in claim 1 wherein said heat sink (12) comprises thermally conductive aluminum material.

15. An assembly (10) as set forth in claim 1 wherein said light emitting diodes (28) on each of said sections (20) are electrically interconnected in series with one another and said light emitting diodes (28) on each of said sections (20) are electrically connected in parallel with said light emitting diodes (28) on other sections (20).

16. A light emitting assembly (10) comprising:
a heat sink (12) of thermally conductive aluminum material presenting a mounting surface (14) and a heat transfer surface (16) facing in the opposite direction from said mounting surface (14),
said heat sink (12) including a plurality of fins (30) extending transversely from said heat transfer surface (16) of said heat sink (12) and disposed in spaced and parallel relationship to one another for transferring heat away from said heat sink (12) to surrounding ambient air,
a coating (34) of electrically insulating material disposed over said mounting surface (14) of said heat sink (12),
said coating (34) being less than one thousand microns in thickness,
a plurality of circuit traces (36) spaced from one another on said coating (34) for preventing electrical conduction between each of said traces (36) so that said coating (34) prevents electrical conduction from each of said traces (36) to said heat sink (12),
a plurality of light emitting diodes (28) disposed in spaces between adjacent ones of said traces (36),
each of said light emitting diodes (28) having a positive lead (38) and a negative lead (40),
said leads (38) of each of said L.E.D.s (28) being in electrical engagement with said adjacent ones of said traces (36) for electrically interconnecting said traces (36) and said light emitting diodes (28),
an adhesive (42) of electrically conductive material securing said leads (38) to said traces (36),
said heat sink (12) including a plurality of elongated slots (18) to define a plurality of sections (20) disposed in spaced and parallel relationship to one another and extending between opposite ends (22) to present side edges (24) of at least one elongated slot (18) between adjacent ones of said sections (20) for allowing ambient air to pass through said elongated slots (18) of said heat sink (12) adjacent said light emitting diodes (28) disposed along each of said sections (20),
one of said fins (30) disposed along each of said edges (24) of each said section (20),
each pair of said fins (30) extending continuously between said ends (22) of each of said sections (20) to present a void space (32) between each pair of said fins (30) and open at said ends (22) for exposing said void space (32) between each pair of said fins (30) to air,
said heat sink (12) including a plurality of bridges (26) being integral and homogenous with said sections (20) and extending transversely to each of said elongated slots (18) to interconnect adjacent sections (20),
said light emitting diodes (28) on each of said sections (20) being electrically interconnected in series with one another and said light emitting diodes (28) on each of said sections (20) being electrically connected in parallel with said light emitting diodes (28) on other sections (20), at least three of said traces (36) extending in end to end relationship along at least one of said sections (20), at least two of said light emitting diodes (28) disposed in each of the two spaces between said three adjacent traces (36) on each one of said sections (20), a housing (50) covering and spaced from said heat transfer surface (16) and said fins (30) for shielding said sections (20), said housing (50) including at least one vent (52) for allowing ambient air to pass through said housing (50), a plurality of connectors (48) securely connecting said housing (50) to at least one of said sections (20), a plurality of independent covers (44) with each cover (44) being light transmissive and disposed over one of said sections (20) so that one cover (44) independently covers said light emitting diodes (28) on said mounting surface (14) of each said section (20) and said covers (44) are separated by said elongated slots (18), each of said covers (44) defining a periphery (46) being in sealed engagement with said mounting surface (14) around said light emitting diodes (28) on each of said sections (20), said connectors (48) securely connecting said covers (44) to said heat sink (12), and a screen (54) disposed over said elongated slots (18) for preventing debris from passing through said elongated slots (18).

\* \* \* \* \*